United States Patent [19]

Ishigaki et al.

[11] Patent Number: 4,531,095
[45] Date of Patent: Jul. 23, 1985

[54] IMPULSE NOISE REDUCTION BY LINEAR INTERPOLATION HAVING IMMUNITY TO WHITE NOISE

[75] Inventors: Yukinobu Ishigaki, Tokyo; Kazutoshi Hirohashi, Yokohama, both of Japan

[73] Assignee: Victor Company of Japan, Limited, Japan

[21] Appl. No.: 585,926

[22] Filed: Mar. 2, 1984

[30] Foreign Application Priority Data

Mar. 7, 1983 [JP] Japan .................................. 58-37130
Mar. 7, 1983 [JP] Japan .................................. 58-37131

[51] Int. Cl.³ ............................................. H03B 1/04
[52] U.S. Cl. ................................... 328/165; 330/149; 455/223
[58] Field of Search ............... 330/149; 328/162–165; 455/303, 312, 223, 222; 375/104; 381/94

[56] References Cited

U.S. PATENT DOCUMENTS 4,305,042  12/1981  Tanaka et al. .................. 328/165 X
4,311,963  1/1982  Watanabe et al. .............. 328/165 X Primary Examiner—James B. Mullins
Attorney, Agent, or Firm—Lowe, King, Price & Becker

[57] ABSTRACT

An analog audio signal is applied to a sampling pulse generator (2) which generates a sampling pulse in response to an impulse noise introduced to the signal and also to a first sample-and-hold circuit (5, 6, 7) which tracks the waveform of the audio signal when impulse noise is nonexistent and holds the signal in the capacitor (6) in response to the sampling pulse. A nonlinear transfer circuit (10) is provided to eliminate white noise contained in the analog signal from the first sample-and-hold circuit and feeds its output to a differentiator (11) to derive a signal representative of the slope ratio of the analog signal. A second sample-and-hold circuit (12) samples the slope ratio signal in response to the sampling pulse and applies the sampled signal to a bidirectional constant current source (8) which provides constant current charging and discharging of the capacitor (6) to linearly vary the voltage sampled by the first sample-and-hold circuit (12).

6 Claims, 6 Drawing Figures

IMPULSE NOISE REDUCTION BY LINEAR INTERPOLATION HAVING IMMUNITY TO WHITE NOISE

RELATED COPENDING APPLICATION

The present application is related to Copending U.S. patent application No. 517,985, filed July 29, 1983 invented by Y. Ishigaki, assigned to the same assignee as the present invention, and titled "Circuit Arrangement for Reconstructing Noise-Affected Signals".

BACKGROUND OF THE INVENTION

The present invention relates generally to noise reduction, and in particular to a noise reduction circuit which eliminates impulse noise that occurs in audio signals using a linear interpolation technique immune to white noise. The invention is particularly useful for applications where the audio signal level is relatively low in comparison with the white noise level.

One method currently available for suppressing impulse noise that contaminates audio signals involves reducing the transmission gain or shutting off the transmission path of the signal as long as the noise is present. Another method involves detecting the amplitude of the wanted signal on the rising edge of an impulse noise and retaining the detected amplitude in the presence of the impulse noise. While these methods are effective in suppressing impulse noise, the noise-affected portion of the signal is not reconstructed, resulting in unnatural sound. To overcome this problem modern digital audio systems utilize linear interpolation technique to predict the original waveform of the noise-affected portion by linear interpolation. This type of systems requires complicated, expensive circuitry, not suitable for moderate cost equipments.

The aforesaid Copending U.S. Application discloses an impulse noise reduction circuit in which the audio signal is passed through a first sample-and-hold circuit which tracks the waveform of the signal when no impulse noise is present and holds the signal level in response to the impulse noise. The slope ratio of the audio signal is detected by a differentiator and sampled by a second sample-and-hold circuit in response to that impulse noise as an indication of the position of the noise of interest in the audio signal waveform. The sampled signal drives a voltage-controlled bidirectional constant current source to linearly vary the voltage sampled by the first sample-and-hold by performing linear charging and discharging of the capacitor thereof.

However, if white noise prevails in the high frequency range of the audio spectrum and the wanted signal level is low relative to the white noise, the white noise is detected by the differentiator and causes an increase in the level of the slope ratio signal which is to be sampled during the noise suppression period. This results in the interpolating voltage deviating from what it should be. Another disadvantage is that an additional noise is introduced by the randomness of the white noise.

SUMMARY OF THE INVENTION

Therefore, the primary object of the invention is to provide an inexpensive impulse noise reduction circuit using a linear interpolation technique which is immune to white noise.

The invention provides a noise reduction circuit which comprises a sampling circuit for generating a sampling pulse in response to an impulse noise introduced to an analog input signal. A first sample-and-hold circuit is coupled in a signal transmissin path from input to output terminals. In tracking modes wherein the impulse noise is nonexistent, the first sample-and-hold follows the waveform of the audio signal. In response to an impulse noise, the first sample-and-hold is triggered by the sampling pulse to sample the audio signal into a storage capacitor. A nonlinear transfer circuit is provided having a nonlinear input-output characteristic for suppressing small amplitude signals including white noise. The transfer circuit is connected from the output of the first sample-and-hold to a differentiator. The slope ratio of the white-noise free audio signal is detected by the differentiator and applied to a second sample-and-hold circuit which is also responsive to the sampling pulse for sampling the slope ratio signal. A voltage-controlled bidirectional constant current source is connected to the storage capacitor and is responsive to the sampled slope ratio signal for performing the linear charging and discharging of the capacitor to vary the voltage stored therein.

By the provision of the nonlinear transfer circuit the acoustophysiological effect of the above noted interpolation distortion is satisfactorily reduced.

Preferably the impulse noise reduction circuit includes a low-pass filter for passing the lower frequency components of the signal from the first sample-and-hold circuit direct to an adder and a high-pass filter for passing the higher frequency components through the nonlinear transfer circuit to the adder whose output is supplied as an input to the differentiator.

BRIEF DESCRIPTION OF THE DRAWINGS

The present invention will be described in further detail with reference to the accompanying drawings, in which.

DETAILED DESCRIPTION

Figure 1:
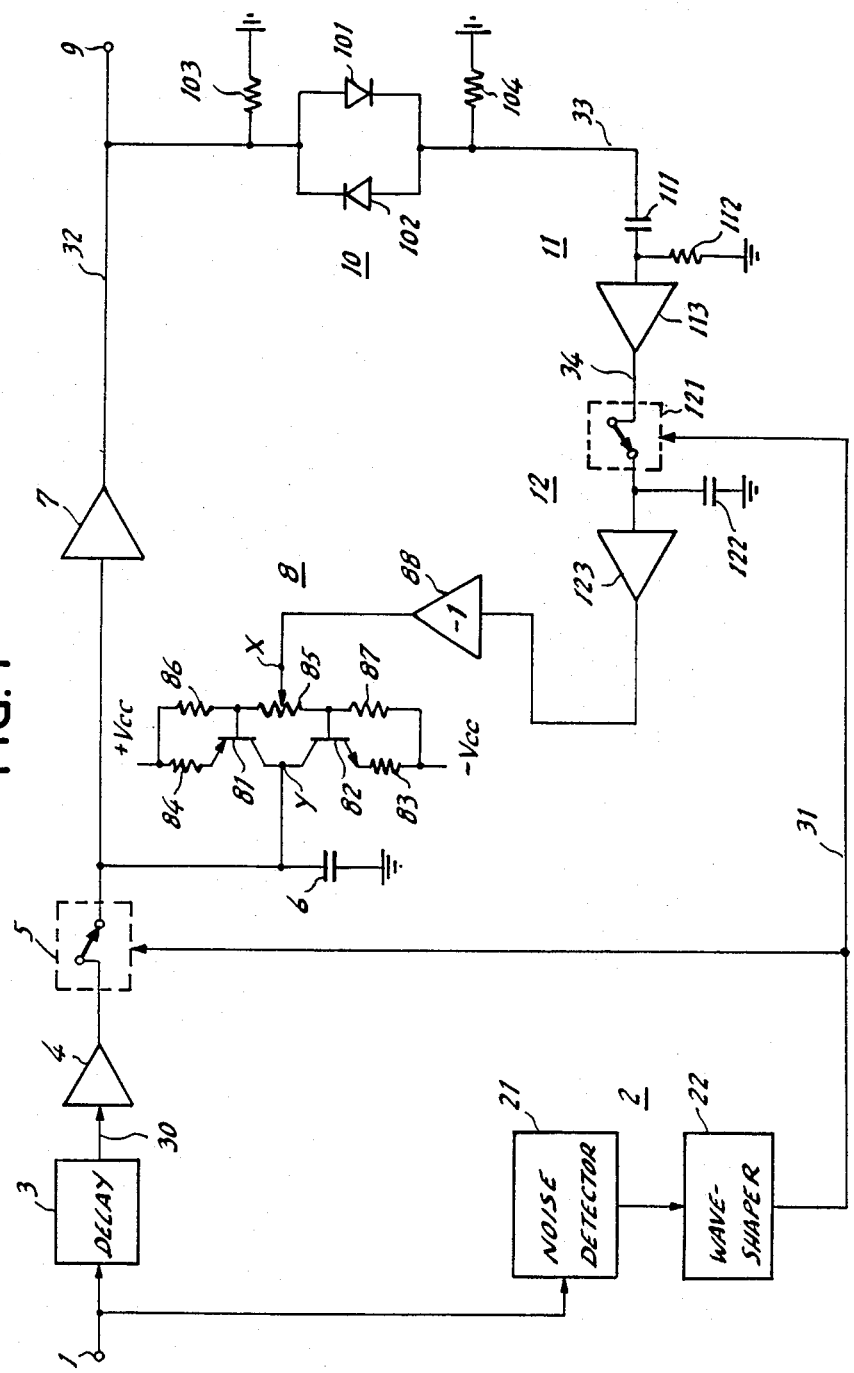
FIG. 1 is a block diagram of an embodiment of the present invention.

Referring now to FIG. 1, there is shown a noise reduction circuit according to an embodiment of the present invention. The circuit comprises a sampling pulse generator 2 coupled to an input terminal 1 to which is applied a noise-affected analog audio signal. The sampling pulse generator 2 includes a noise detector 21 which responds to an impulse noise in the audio signal by generating an output signal. This signal is shaped by a waveshaper 22 into a rectangular sampling pulse. In a manner as will be described this pulse will be used for cutting off the transmission path of the audio signal from the input terminal 1 to an output terminal 9 when an impulse noise is detected and for generating a linear interpolating voltage to reconstruct the cutoff portion of the signal. When impulse noise is not present, the noise reduction circuit of the invention operates in a tracking mode by following the waveform of the analog signal and operates in a sampling mode when an impulse noise is detected to approximate the lost portion of the signal by linear interpolation.

A delay circuit 3, coupled to the input terminal 1, introduces a delay time corresponding to the inherent delay time of the sampling pulse generator 2 so that the sampling pulse is time-coincident with the impulse noise. The delayed audio signal is amplified by a first buffer amplifier 4 having a low output impedance and charges a capacitor 6 through a normally closed analog switch 5 so that the voltage developed in capacitor 6 tracks the waveform of the input signal during tracking modes. The voltage developed in capacitor 6 is amplified by a second buffer amplifier 7 having a high input impedance. The switch 5, capacitor 6 and buffer amplifier 7 combine to form a first sample-and-hold circuit to sample a voltage that occurs immediately prior to the occurrence of a noise pulse. The output of this sample-and-hold circuit is applied to the output terminal 9 and also to a nonlinear transfer circuit 10. This transfer circuit comprises a pair of diodes 101 and 102 having identical nonlinear operating characteristics connected in anti-parallel relationship and a pair of input and output voltage developing resistors 103 and 104 connected one on each side of the anti-parallel connected diodes.

The output of the transfer circuit 10 is applied to a differentiator, or slope ratio detector 11 which is formed by a capacitor 111, a resistor 112 and a buffer amplifier 113. The slope ratio signal is fed to a second sample-and-hold circuit 12 comprising a normally closed switch 121, a storage capacitor 122 and a buffer amplifier 123. The switch 121 is responsive to the sampling pulse to sample the slope ratio signal into the capacitor 122. The voltage thus sampled indicates in which portion of the audio signal the impulse noise has occurred.

A voltage-controlled bidirectional constant current source 8 is provided to perform the constant-current charging and discharging of the capacitor 6 at a rate depending on the slope ratio signal supplied from the sample-and-hold circuit 12. The constant current source 8 comprises a pair of transistors 81 and 82 of opposite conductivity types connected in series between a positive voltage supply +Vcc and a negative voltage supply −Vcc through resistors 83 and 84, respectively. The transistors 81 and 82 are biased by potentials developed at opposite terminals of a potentiometer 85 which are connected respectively to the voltage sources through resistors 86 and 87. The collectors of transistors 81 and 82 are coupled together to the capacitor 6 and the tap point of the potentiometer 85 is connected to the output of the sample-and-hold circuit 12 by way of a unity gain inverting amplifier 28. The potentiometer 85 is so adjusted that for a zero-volt setting at a node X a corresponding zero volt potential appears at a node Y. The impedance value at the node Y is considerably high in comparison with the output impedance of the buffer amplifier 4 so that the constant current source 8 provides little or no effect on the signal that passes from amplifier 4 to amplifier 7 during tracking modes.

The operation of this constant current source is such that when a positive input potential is applied thereto the transistor 81 is rendered more conductive than is transistor 82 and supplies more current to the node Y than the current drained therefrom by transistor 82. As a result, the node Y is driven to a positive potential equal to the potential developed at node X. The capacitor 6 is thus charged linearly at a rate proportional to the amplitude of the positive-going input pulse. A negative input potential, on the other hand, renders the transistor 82 more conductive than transistor 81 to drain more current from the node Y than the current supplied thereto through transistor 81, so that the node Y is driven to a negative potential equal to the potential at node X. The capacitor 6 is thus discharged linearly at a rate proportional to the amplitude of the negative going pulse.

Figure 2:
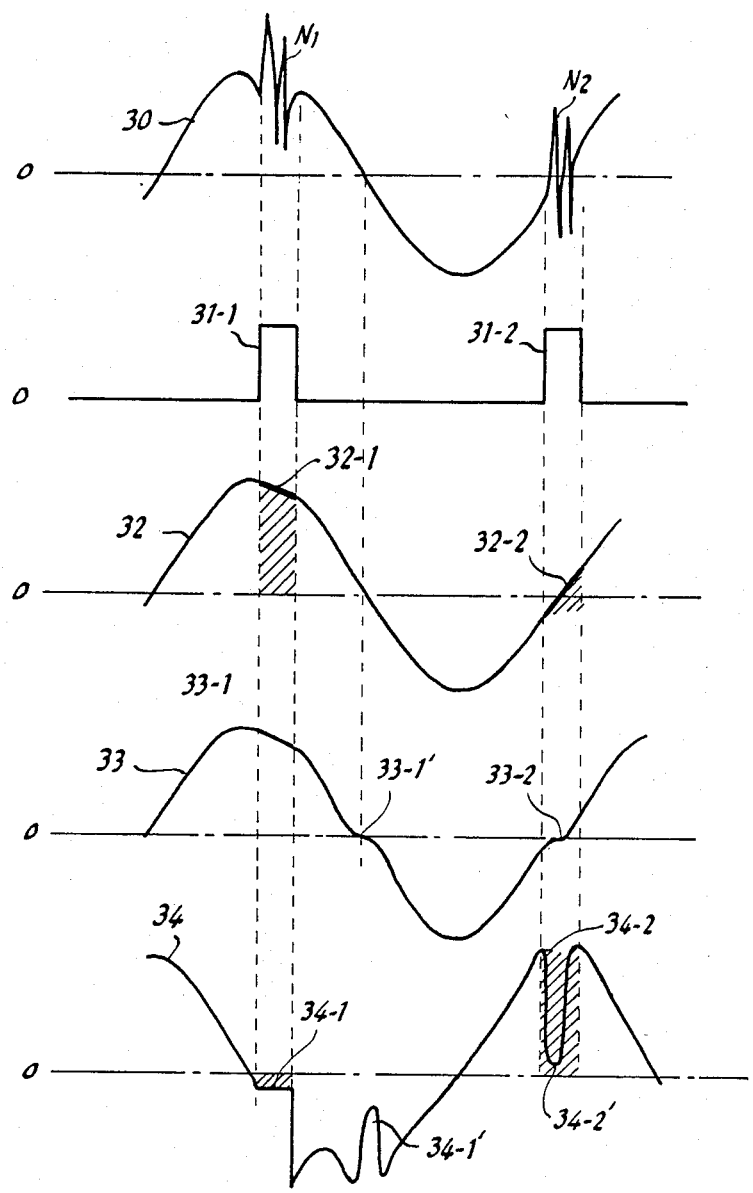
FIG. 2 is a waveform diagram useful for describing the operation of the FIG. 1 embodiment.

The operation of the noise reduction circuit will be better understood with the aid of waveforms shown in FIG. 2.

During the tracking mode, the switch 5 remains closed to pass an input audio signal 30 through the transmission path to the output terminal 9 at which it appears as a waveform 32, the output signal being further applied to the nonlinear transfer circuit 10 whose operation will be discussed later. During this tracking mode the output of differentiator 11 varies continuously with the input signal as shown at 34 as an indication of the slope ratio of the audio signal and is applied to the sample-and-hold 12. Since the output impedance of the constant current source is much higher than the output impedance of the buffer amplifier 4, the signal passing through the sample-and-hold circuit 12 to the constant current source 8 produces little effect on the transmission of the audio signal to the output terminal 9 and the voltage developed in the capacitor 6 follows the waveform of the signal delivered to the output terminal 9.

For purposes of illustration, it is assumed that the input signal is affected by noise impulses $N_1$ and $N_2$ which occur respectively on a downhill slope of the audio signal near positive peak where its slope ratio is of a near minimum value and on an uphill slope of the signal at a zero-crossing point where its slope ratio is at maximum. The sampling pulse generator 2 generates sampling pulses 31-1 and 31-2 in response to the noises $N_1$ and $N_2$, respectively. In response to sampling pulse 31-1, the noise reduction circuit operates in the sampling mode in which the switches 5 and 121 open. The transmission path is cut off to prevent the noise $N_1$ from being transmitted to the output terminal 9 and the capacitor 6 is disconnected from the low output impedance circuit of the buffer amplifier 4. The differentiator 11 develops a negative voltage 34-1 which is sampled into the capacitor 122. This sampled value bears the information on the slope ratio of the signal and its polarity at the moment immediately prior to the occurrence of the noise $N_1$.

The sampled negative voltage 34-1 causes the constant current source 8 to discharge the capacitor 6 linearly at a rate proportional to the slope ratio of the signal at the instant immediately prior to the occurrence of the noise $N_1$, whereby the voltage sampled into the capacitor 6 is linearly varied, generating an interpolating voltage which is indicated by a line segment 32-1. This voltage interpolates the noise suppressed period and approximates the signal that has been lost in the sampling period.

Figure 3:
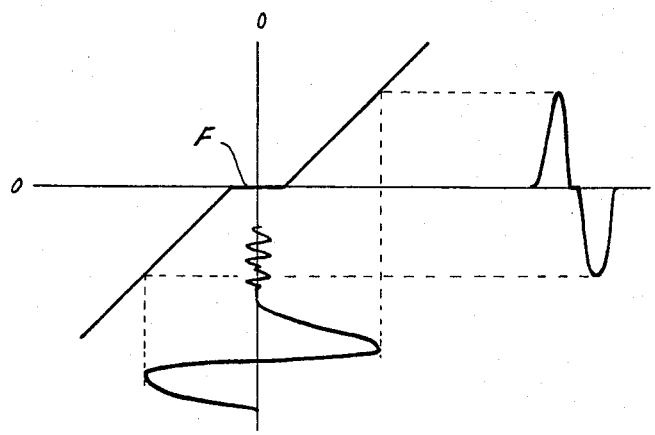
FIG. 3 is a graphic illustration of the operating characteristic of the nonlinear transfer circuit of FIG. 1.

The operation of the nonlinear transfer circuit 10 is as follows. This transfer circuit has a nonlinear transfer function as shown in FIG. 3 including a substantially flat portion F covering small amplitude variations above and below zero-volt level. Due to this zero crosspoint flat response, small amplitude white noise diminishes to an insignificant level. Due to the zero-crossover nonlinearity, large amplitude signals undergo crossover distortion as they pass through the transfer circuit 10 as indicated at 33-1' in FIG. 2 and such a distortion causes a voltage rise 34-1' at the output of differentiator 11.

Since the noise 34-1' occurs outside of the interpolation period, the interpolation voltage is not affected.

In the case of the impulse noise $N_2$, the output signal 33 of the transfer circuit 10 has a crossover distortion 33-2 immediately following the leading edge of a sampling pulse 31-2 and therefore the slope ratio signal 34 is sampled at a point 34-2 and drops sharply to a level 34-2' corresponding to the distortion 33-2. The sampled positive signal 34-2 causes the constant current source 8 to charge the storage capacitor 6 linearly so that the audio signal is interpolated as at 32-2.

If the voltage variations 34-1' and 34-2' are time-coincident with the leading edge of a sampling pulse 31, an incorrect slope ratio may be sampled. This will cause the interpolation voltage to remain at a constant level, causing a slight interpolation distortion.

However, the distortion of this type is more acousto-physiologically tolerable than distortions of the type caused by the otherwise differentiated white noise. Furthermore, such interpolation distortion occurs only when the crossover distortion coincides with a zero crosspoint of the audio signal. Such coincidence occurs very seldom since the voltage variations 34-1' and 34-2' have a small duration as compared with the interval between successive crosspoints of the audio signal.

Figure 4:
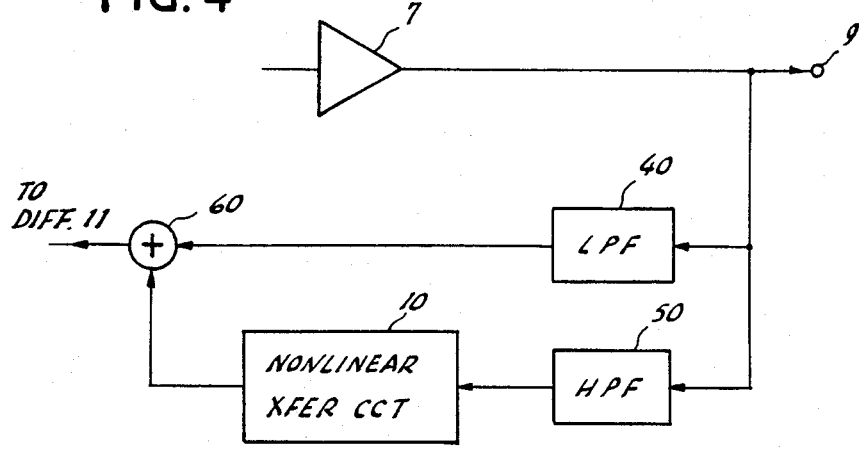
FIG. 4 is a block diagram of a modified embodiment of the present invention.

FIG. 4 shows a preferred embodiment of the present invention. In FIG. 4, the feedback signal from the buffer amplifier 7 is applied through a low-pass filter 40 to a first input of an adder 60 on the one hand, and through a high-pass filter 50 to the nonlinear transfer circuit 10 and thence to the second input of the adder 60. The cut-off frequency of the high-pass filter 50 corresponds to that of the low-pass filter 40 so that the combined characteristic of these filters provides a flat response over the spectrum with a crossover at the common cut-off frequency. Since the white noise is in the higher frequency range of the audio spectrum, it passes through the high-pass filter 50 to the transfer circuit 10, whereas the lower frequency components pass through the low-pass filter 40 and fed to the differentiator 11 bypassing the nonlinear transfer circuit 10. Therefore, the impulse noise that occurs at or near zero crosspoints of the lower frequency components of the audio signal is free from the interpolation distortion discussed above.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A noise reduction circuit having an input terminal to which an analog audio signal is applied and an output terminal from which a noise-suppressed audio signal is delivered, comprising:

means coupled to said input terminal for generating a sampling pulse in response to an impulse noise introduced to said analog signal;

a first sample-and-hold circuit having a capacitor, switch means provided in a signal transmission path from said input terminal to said output terminal and to said capacitor, said switch means being responsive to said sampling pulse for disconnecting said signal transmission path to said output terminal and to said capacitor for sampling said analog signal into said capacitor;

a transfer circuit coupled to the output of the first sample-and-hold circuit, the transfer circuit having a nonlinear input-output characteristic for eliminating white noise;

a differentiator coupled to the output of the transfer circuit for generating a signal representative of the slope ratio of said analog signal;

a second sample-and-hold circuit coupled to the output of the differentiator for sampling said slope ratio signal in response to said sampling pulse; and a constant current charging and discharging circuit coupled to said capacitor for linearly charging and discharging said capacitor in response to the signal sampled by said second sample-and-hold circuit.

2. A noise reduction circuit as claimed in claim 1, wherein said transfer circuit comprises a pair of antiparallel connected nonlinear unidirectionally conducting semiconductor devices.

3. A noise reduction circuit as claimed in claim 1, further comprising a low-pass filter and a high-pass filter, both of said filters having a common cut-off frequency and having their inputs coupled together to the output of said first sample-and-hold circuit, wherein said transfer circuit is coupled to the output of said high-pass filter, the output of said low-pass filter and the output of the transfer circuit being combined to form an input signal to said differentiator.

4. A noise reduction circuit as claimed in claim 1, wherein said charging and discharging circuit comprises a pair of transistors of opposite conductivity types connected in a series circuit between voltage supplies of opposite polarities, and a resistor network for biasing said transistors in response to the output signal from said second sample-and-hold circuit, a junction between said transistors being coupled to said capacitor.

5. A noise reduction circuit as claimed in claim 1, wherein a buffer amplifier having a low output impedance is provided in said signal transmission path between said input terminal and said switch means, said constant charging and discharging circuit having a large output impedance which is coupled to said capacitor.

6. A noise reduction circuit as claimed in claim 5, further comprising a second buffer amplifier having a high input impedance coupled in said signal transmission path from the first-mentioned buffer amplifier to said output terminal.

* * * * *